US011037809B2

(12) United States Patent
Hung et al.

(10) Patent No.: US 11,037,809 B2
(45) Date of Patent: Jun. 15, 2021

(54) TRANSFER DEVICE AND METHOD FOR TRANSFERRING SUBSTRATE WITHOUT UNEXPECTED ROTATION

(71) Applicant: Taiwan Semiconductor Manufacturing Co., Ltd., Hsinchu (TW)

(72) Inventors: Pei-Lun Hung, Taoyuan (TW); Chia-Wei Hsu, New Taipei (TW); Chia-Hsiang Liao, New Taipei (TW); Ming-Hung Chen, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 32 days.

(21) Appl. No.: 16/513,837

(22) Filed: Jul. 17, 2019

(65) Prior Publication Data

US 2021/0020486 A1 Jan. 21, 2021

(51) Int. Cl.

*H01L 21/677* (2006.01)
*H01L 21/683* (2006.01)
*H01L 21/687* (2006.01)
*B25J 11/00* (2006.01)

(52) U.S. Cl.

CPC ...... *H01L 21/67766* (2013.01); *H01L 21/683* (2013.01); *H01L 21/687* (2013.01); *H01L 21/6838* (2013.01); *B25J 11/0095* (2013.01); *Y10S 414/141* (2013.01)

(58) Field of Classification Search

CPC ............... B25J 11/0095; B25J 15/0666; H01L 21/67742; H01L 21/67766; H01L 21/683; H01L 21/6838; H01L 21/687; H01L 21/68707; Y10S 414/141
USPC ................................ 294/64.3, 213; 414/941
See application file for complete search history.

(56) References Cited

U.S. PATENT DOCUMENTS 3,438,668 A * 4/1969 Williams .............. B66C 1/0268 294/64.3
5,077,888 A * 1/1992 Tokisue ................ B23P 19/006 29/467
6,152,507 A * 11/2000 Pirker .................. B65G 47/911 294/64.3
6,761,362 B2 * 7/2004 Noguchi ........... H01L 21/67288 118/503
6,866,468 B2 * 3/2005 Moller .................... H01L 21/68 414/783
8,444,126 B2 * 5/2013 Siebert .............. H01L 21/68728 269/21

(Continued)

*Primary Examiner* — James Keenan
(74) *Attorney, Agent, or Firm* — McClure, Qualey & Rodack, LLP

(57) ABSTRACT

A transfer device for transferring a substrate is provided, including a base plate, at least one suction unit disposed on a side of the base plate to generate suction on the substrate, and a plurality of movement restriction units disposed on the side of the base plate to limit the movement of the substrate during transfer. Each of the movement restriction units includes a main body, an abutting member, and a pusher. The main body is attached to the base plate and has a chamber therein. The abutting member is movably received in the chamber and has an abutting portion that protrudes beyond the main body to abut the substrate. The pusher is received in the chamber and configured to push the abutting member to move toward the substrate.

20 Claims, 10 Drawing Sheets

15
A
154
151
153
1531
152
152
1531
153
1532
1532
WP
W

(56) References Cited

U.S. PATENT DOCUMENTS

| | | | | |
|---|---|---|---|---|
| 8,822,310 | B2 * | 9/2014 | Lackner | H01L 21/02104<br>438/464 |
| 8,870,627 | B2 * | 10/2014 | Fukushima | B24B 37/042<br>451/60 |
| 9,911,640 | B2 * | 3/2018 | Kesil | H01L 21/67259 |
| 10,242,903 | B2 * | 3/2019 | Ichinose | B25J 11/0095 |
| 10,460,975 | B2 * | 10/2019 | Torii | H01L 21/67092 |
| 2015/0179495 | A1 * | 6/2015 | Huang | H01L 21/68728<br>356/237.5 |

* cited by examiner 153
1531
D1
1532
152
154
W
151
151A
141
15

TRANSFER DEVICE AND METHOD FOR TRANSFERRING SUBSTRATE WITHOUT UNEXPECTED ROTATION

BACKGROUND

Integrated circuits (ICs) are fabricated on semiconductor wafers, and each wafer typically contains hundreds or thousands of individual integrated circuits, depending on the size of the wafer and the size of the individual integrated circuits. Between the integrated circuits are spaces, known as "cutting grooves (or scribe lines)", which separate the individual integrated circuits on the wafer. In a process known as "cutting (or dicing)", wafers are cut along the cutting grooves to form separate integrated circuits, known as "dies".

One way to singulate wafers is to use a process called dicing-before-grinding (DBG) process, typically used in 200 mm diameter or lager wafers. According to the DBG process, a semiconductor wafer is cut along scribe lines to a predetermined depth, rather than over the full thickness of the wafer, to form grooves along the scribe lines on an active surface (with circuit patterns thereon) of the wafers. Afterwards, the back surface of the wafer is grinded to make the thickness of the wafer not more than the depth of the grooves, for example, about 50 microns (μm), thereby dividing the wafer into individual integrated circuits or dies. Through this approach, the risk of damage to wafers is reduced and ultra-thin dies can be produced with stability.

Although existing cutting apparatuses and methods have been adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

Figure 1:
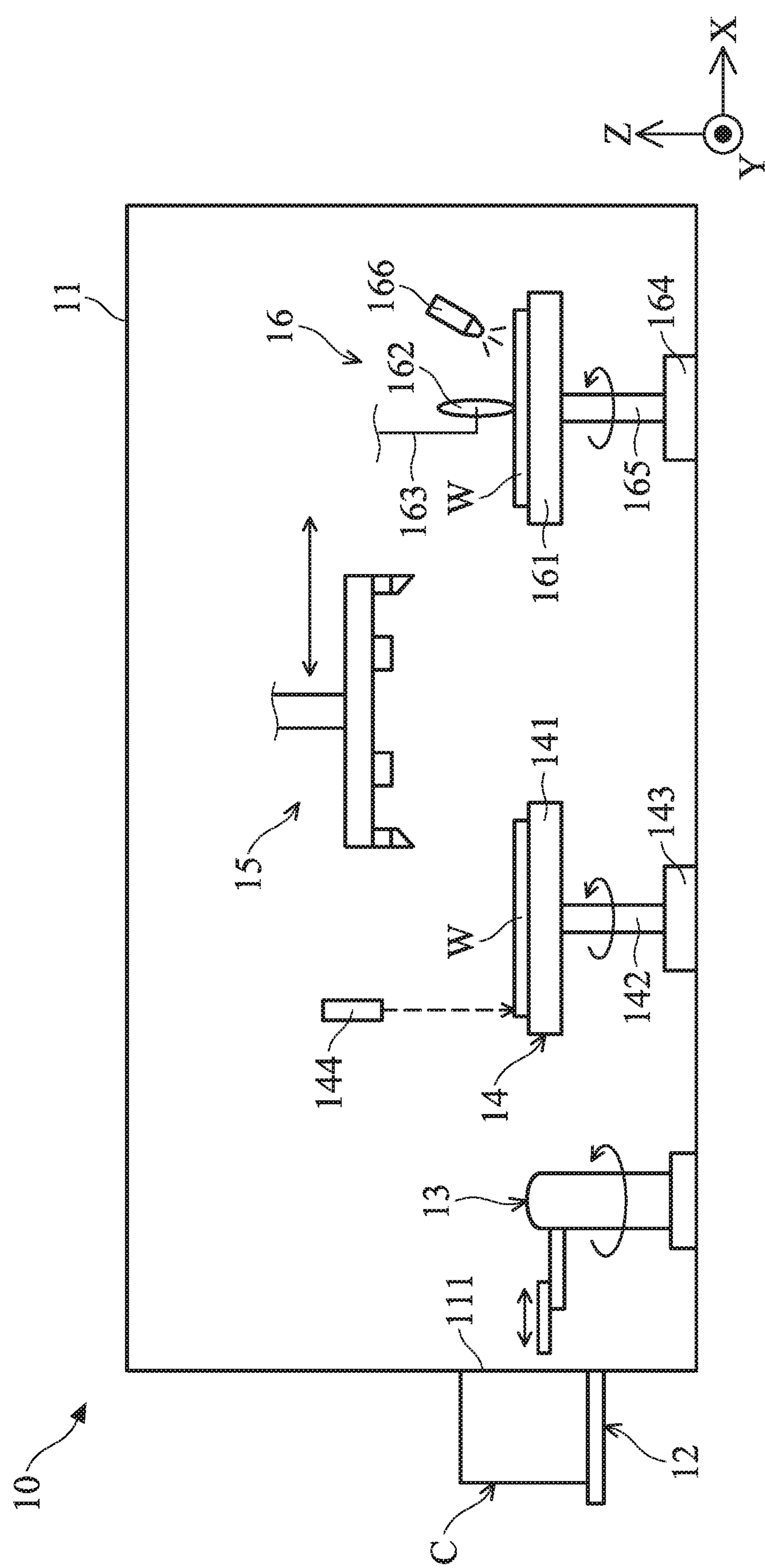
FIG. 1 is a schematic and diagrammatic view of a cutting apparatus, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that additional operations can be provided before, during, and after the method, and some of the operations described can be replaced or eliminated for other embodiments of the method.

Embodiments of a cutting apparatus for performing a cutting process on a substrate (e.g., a semiconductor wafer) are provided. The cutting process may be performed to cut a substrate into small dies each containing a circuit pattern fabricated by various processes, such as lithography, etching, etc. While the dicing-before-grinding (DBG) process is performed in some embodiments, the cutting process performed is to cut a substrate along scribe lines to a predetermined depth, rather than over the full thickness of the substrate, to form grooves along the scribe lines on an active surface of the substrate (also referred to as a "pre-cut" process).

FIG. 1 is a schematic and diagrammatic view of a cutting apparatus 10 in accordance with some embodiments. The cutting apparatus 10 includes a processing chamber 11 where the cutting process is performed. One or more load ports 12 are provided on the front side of the processing chamber 11 (only one load port 12 is depicted due to the restricted viewing angle) and operable for supporting and docking the cassette pod C to facilitate insertion and removal of substrates W into and from the processing chamber 11. In some embodiments, one load port 12 is provided to support a cassette pod C for containing a plurality of unprocessed substrates W (i.e. to be cut or diced), and another load port 12 is provided to support another cassette pod C for containing the processed substrates W (i.e., have been subjected to the cutting process).

In some embodiments, the processing chamber 11 further has one or more access doors 111 corresponding to the load ports 12, through which the substrates W are loaded into and unloaded from the processing chamber 11.

Although not shown, each of the substrates W to be diced may have crosswise scribe lines formed on its active surface (e.g., the shown upper surface). In some embodiments, the scribe lines are arranged at regular intervals in the form of lattice to define a lot of rectangular dies each having a circuit pattern formed therein. For example, on the substrate W, scribe lines may be formed in two directions perpendicular to each other (such as horizontal directions including the X direction and the Y direction in FIG. 1), and the scribe lines in the X direction or the Y direction parallel to one another are equidistant. The scribe lines can be predefined in the previous processes, such as lithography, etching, etc. In some alternative embodiments, the substrate W to be diced may have different scribe-line patterns.

In some embodiments shown in FIG. 1, there are a first transfer device 13, a positioning station 14, a second transfer device 15, and a cutting station 16 provided in the processing chamber 11. It should be understood that some additional elements can be added into the processing chamber 11 in different embodiments, and some of the elements described below can be replaced or eliminated in other embodiments of the cutting apparatus 10.

The first transfer device 13 may be raised or lowered (in the Z direction), moved leftward and rightward (in the Y direction), moved forward and backward (in the X direction), and rotated about the vertical axis so as to transfer the unprocessed substrates W from the cassette pod C for the unprocessed substrates W to the positioning station 14. In some embodiments, the first transfer device 13 is a multi-axis robot manipulator or the like. The first transfer device 13 loads the unprocessed substrate W to a positioning stage 141 of the positioning station 14 for orientating the unprocessed substrate W prior to the subsequent cutting process.

The positioning stage 141 may include a holding portion that holds the unprocessed substrate W while the substrate orientation is being performed. In some embodiments, the positioning stage 141 secures the back surface (e.g., the shown lower surface) of the unprocessed substrate W to its support surface by vacuum force. However, other forces or clamping mechanisms can also be used in different embodiments. Moreover, a driving mechanism 143 (e.g., a motor) is coupled to the positioning stage 141 so as to drive the positioning stage 141 and the unprocessed substrate W thereon to rotate about a rotation shaft 142 during the substrate orientation.

In some embodiments, the positioning station 14 further includes an orientation detector 144 configured and operable to detect the orientation of the unprocessed substrate W secured on the positioning stage 141. The orientation detector 144 may detect a notch, a flat edge, or another type of orientation feature of the unprocessed substrate W by an optical means or other suitable mechanisms. When the orientation detector 144 detects the orientation feature of the unprocessed substrate W, it generates a positional signal and sends the positional signal to a control module (e.g., a computer; not shown). The control module then controls, according to the positional signal, the driving mechanism 143 to rotate the positioning stage 141 so that the unprocessed substrate W is properly oriented for the subsequent cutting process. Thereafter, the second transfer device 15 is controlled by the control module to transfer the oriented unprocessed substrate W from the positioning stage 141 to the cutting station 16.

The second transfer device 15 may be raised or lowered (in the Z direction), moved leftward and rightward (in the Y direction), and moved forward and backward (in the X direction) so as to transfer the oriented unprocessed substrate W from the positioning stage 141 to a cutting stage 161 of the cutting station 16 for performing the cutting process. The detailed structure of the second transfer device 15 and the method of transferring a substrate utilizing the second transfer device 15 according to some embodiments will be described in detail later.

The cutting station 16 is configured and operable to perform a cutting process on the substrate W secured on the cutting stage 161. In some embodiments where the dicing-before-grinding (DBG) process is performed, the cutting station 16 is operable to perform a cutting process (also referred to as a "pre-cut" process) to dice the substrate W along scribe lines to a predetermined depth, rather than over the full thickness of the substrate W, to form cutting grooves along the scribe lines on the active surface of the substrate W.

In some embodiments shown in FIG. 1, the cutting station 16 includes a cutting blade 162. The cutting blade 162 is set to correspond to the center of the cutting stage 161. During the cutting process, the cutting blade 162 is operable to rotate at high speeds, such as between about 30,000 and about 60,000 revolutions per minute, on a spindle 163 and to contact the active surface (e.g., the shown upper surface) of the substrate W. The cutting blade 162 may be powered in a variety of manners including via electric or pneumatic motors (not shown). Additionally or alternatively, the cutting station 16 can also cut the substrate W by a high power laser using a laser blade in some other embodiments.

In some embodiments, the cutting stage 161 secures the back surface of substrate W (e.g., the shown lower surface) to its support surface by vacuum force during the cutting process. However, other forces or clamping mechanisms can also be used. Moreover, a driving mechanism 164 is coupled to the cutting stage 161 so as to drive the cutting stage 161 and the substrate W thereon to rotate and/or move during the cutting process. For example, in some embodiments, the driving mechanism 164 is operable to rotate the cutting stage 161 about a rotation shaft 165 and move the cutting stage 161 laterally in two perpendicular directions (such as the X direction and the Y direction in FIG. 1) relative to the operating cutting blade 162 (or the laser blade) to cut the substrate W to form cutting grooves along the scribe lines on the active surface of the substrate W (e.g., in the "pre-cut" process).

In some embodiments, the cutting station 16 further includes a liquid dispensing device 166 (such as a jet nozzle device) configured and operable to dispense a cleaning solution (e.g., deionized (DI) water or other suitable cleaning solution) over the substrate W secured on the cutting stage 161 to cleanse the substrate W and associated singulated dies during the cutting process. The applied cleaning solution also helps to take the heat generated during the cutting process away from the substrate W, thereby reducing damage to the dies if the generated heat is not appropriately dissipated.

After completion of the cutting process, the cutting blade 162 (or the laser blade) is removed from above the processed substrate W, and the second transfer device 15 is operable to transfer the processed substrate W from the cutting stage 161 to the first transfer device 13. Then, the first transfer device 13 is also operable to transfer the processed substrate W to the cassette pod C for the processed substrates W (i.e., unload the processed substrate W from the processing chamber 11). Although not shown, a conveyor may reach the load port 12 and transfer the cassette pod C for the processed substrates W to another processing machine (e.g., a grinding apparatus for use in the DBG process) in the processing sequence.

Figure 2:
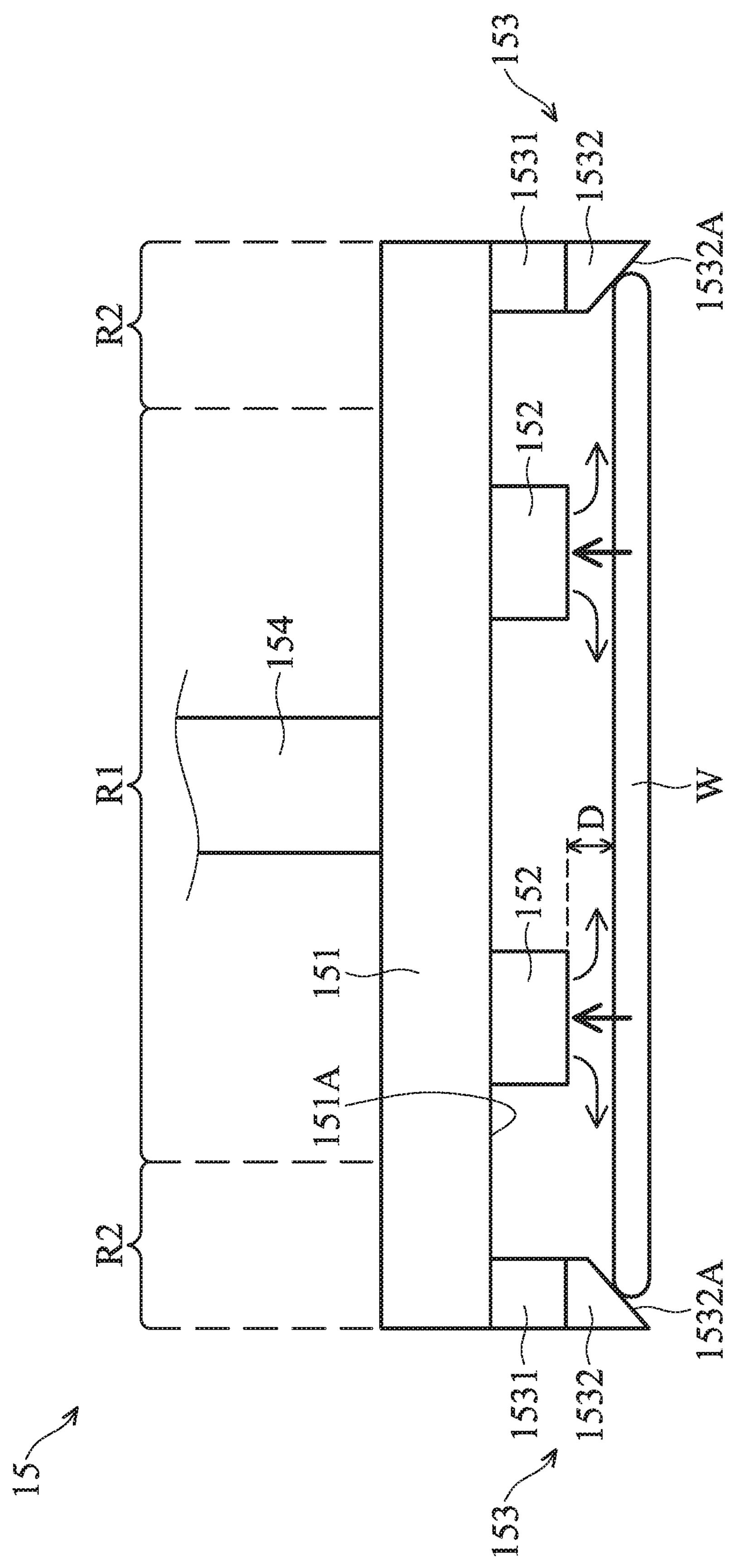
FIG. 2 is a schematic and diagrammatic view of the second transfer device in FIG. 1, in accordance with some embodiments.

Next, referring to FIG. 2, which is a schematic and diagrammatic view of the second transfer device 15 (for the sake of simplicity, hereinafter referred to as the "transfer device 15") in FIG. 1, in accordance with some embodiments. In some embodiments, the transfer device 15 includes a base plate 151, one or more suction units 152, and a plurality of movement restriction units 153. It should be appreciated that the features described below can be replaced or eliminated in other embodiments of the transfer device 15.

In the transfer device 15, the suction units 152 and the movement restriction units 153 may be mounted on a support surface 151A (e.g., the shown lower surface) of the base plate 151 facing the substrate W to be transferred. In some embodiments, a driving mechanism (not shown) is coupled to the base plate 151 via a connection shaft 154 so as to drive the transfer device 15 to transfer substrates W among the first transfer device 13, the positioning station 14, and the cutting station 16 as described above.

In some embodiments, the base plate 151 has a circular shape (i.e., the support surface 151A is circular). However, other suitable shapes can also be used. In some embodiments, the suction units 152 may be arranged in a central region R1 (e.g., a circular region) of the base plate 151. The movement restriction units 153 may be distributed in an outer peripheral region R2 (e.g., an annular region) of the base plate 151 surrounding the central region R1. For example, the movement restriction units 153 may be arranged along the edge of the base plate 151, in some embodiments shown in FIG. 2. The number and position of the suction units 152 and the movement restriction units 153 can vary in different embodiments.

The suction units 152 may be configured and operable to generate suction on the substrate W. In some embodiments, the suction units 152 are operable to generate suction to grip or hold the substrate W in a non-contact manner. For example, each of the suction units 152 may be a Bernoulli suction unit (or nozzle) that is operable to blow out a pressurized air from its spraying hole in the direction of the movement restriction units 153. Based on the Bernoulli principle, a suction force (i.e., a lifting force; as indicated by the up arrows in FIG. 2) is generated and acts on the substrate W so that the substrate W can be lifted without abutting against the lower surfaces of the suction units 152. In some embodiments, when the substrate W is stably secured (i.e., do not float up and down) by the transfer device 15, it is located at a position with a distance D of about 0.5 mm from the lower surfaces of the suction units 152. Since this is a non-contact suction method, it can avoid damage (e.g., scratch) to the active surface (e.g., the shown upper surface) of the substrate W clamped by the transfer device 15. It should be appreciated that other suitable mechanisms or means that grip or clamp the substrate W in a non-contact manner can also be used.

The movement restriction units 153 may be configured to limit the movement (e.g., rotation about the vertical axis) of the substrate W during the transfer. In some embodiments, the movement restriction units 153 are configured to limit the movement or rotation of the substrate W by contacting the edge points of the substrate W via an abutting member 1532 of the respective movement restriction units 153, as shown in FIG. 2. The abutting member 1532 is configured below a main body 1531 of the movement restriction unit 153 so as to contact or touch the substrate W. In some embodiments, the abutting member 1532 has an inclined surface 1532A so as to make point contact with the substrate W. In some embodiments, the abutting member 1532 comprises a wear resistant material, for example, polytetrafluoroethylene (PTFE) or the like, in order to reduce debris caused by friction between the abutting members 1532 and the substrate W.

Figure 3:
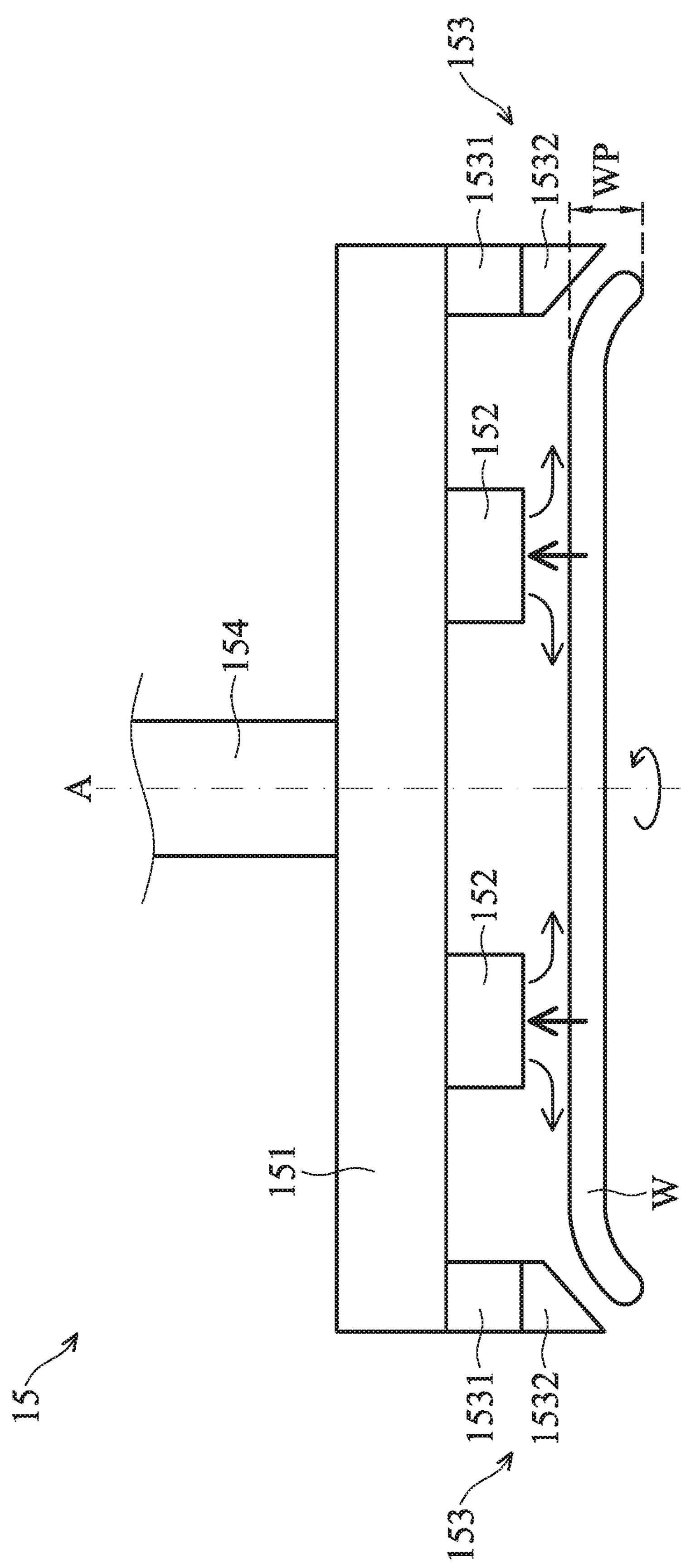
FIG. 3 schematically shows that the abutting members of the second transfer device cannot touch the substrate due to severe warpage of the substrate.

It has been observed that the initially flat substrates W are prone to warp due to high levels of intrinsic stress of various deposited material films or layers. Furthermore, the increased substrate diameter will make the substrates W more sensitive to warpage, causing the abutting members 1532 may not be able to touch or contact the substrate W during the transfer, as shown in FIG. 3. In some cases where the warpage direction of the substrate W is down (i.e., the bowed substrate W is in the form of a crying face) and the degree of warpage WP exceeds about 200 μm, the abutting members 1532 can easily lose contact with the substrate W. As a result, the substrate W may rotate about the vertical axis A during transportation through the transfer device 15 (see FIG. 3), causing an abnormality in the subsequent processes. For example, if the substrate W is rotated during transfer to the cutting stage 161, it will have an improper orientation for use in the cutting process, and needs to be manually corrected by the operator (that can waste time and increase costs).

Figure 4:
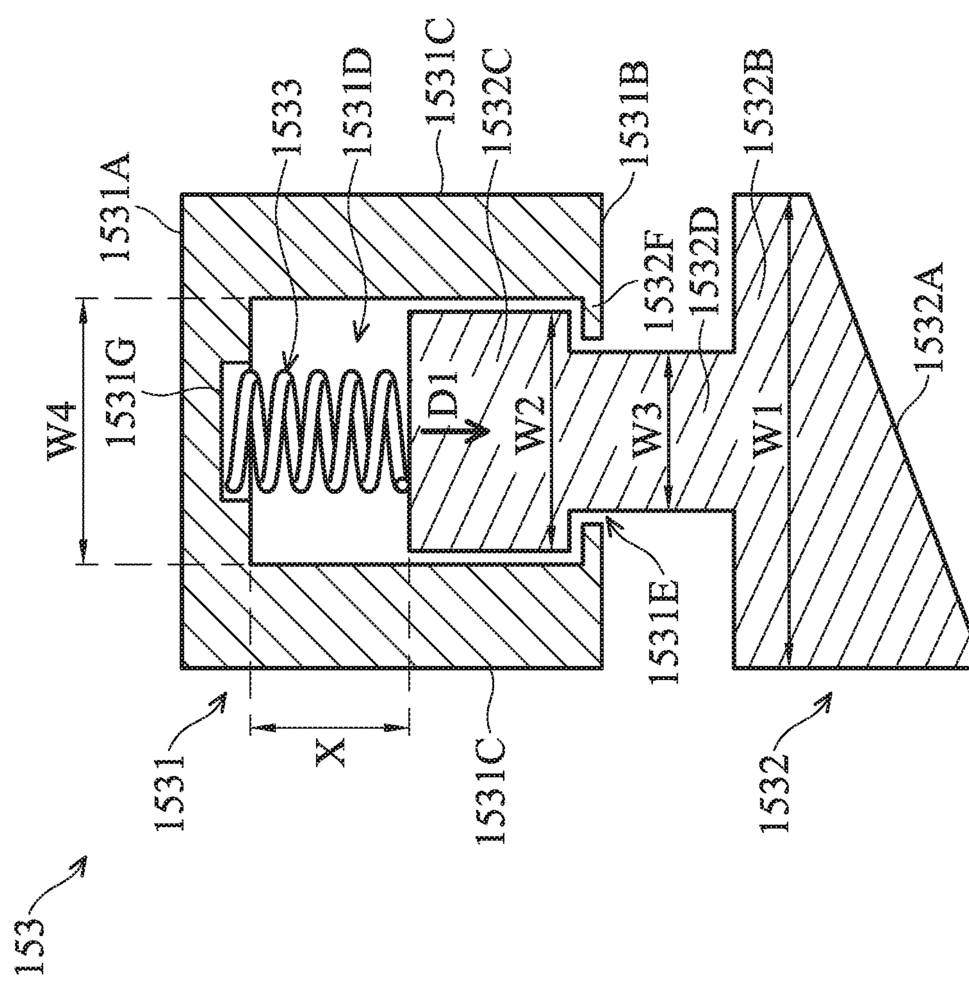
FIG. 4 is a schematic cross-sectional view showing the configuration of the movement restriction unit of the second transfer device in accordance with some embodiments.

FIG. 4 is a schematic cross-sectional view showing the configuration of the movement restriction unit 153 of the transfer device 15 in accordance with some embodiments, wherein the abutting member 1532 of the movement restriction unit 153 continuously contacts or touches the substrate W during the transfer. In some embodiments, the movement restriction unit 153 includes a main body 1531, an abutting member 1532, and a pusher 1533. It should be understood that some features described below can be replaced or eliminated in other embodiments of the movement restriction unit 153. Though only one movement restriction unit 153 is depicted for simplicity, it should be understood that each movement restriction unit 153 can have the same or similar configuration.

The main body 1531 may be configured to mount the movement restriction unit 153 to the base plate 151 (see FIG. 2) of the transfer device 15. In some embodiments, the main body 1531 is a substantially hexahedral structure, including a top wall 1531A, a bottom wall 1531B opposite the top wall 1531A, and four sidewalls 1531C (only two sidewalls 1531C are depicted) connected between the top wall 1531A and the bottom wall 1531B. However, the main body 1531 can also have other suitable shapes in different embodiments. When assembled, the top wall 1531A of the main body 1531 can be connected to the base plate 151 of the transfer device 15, for example, by screws or other suitable connection means. In some embodiments, the main body 1531 comprises a metal material, such as aluminum (Al).

In some embodiments, as shown in FIG. 4, the main body 1531 further forms a hollow chamber 1531D therein, and the chamber 1531D communicates with the outside through an opening 1531E of the bottom wall 1531B. The abutting member 1532 may be movably received in the chamber 1531D, and have an abutting portion 1532B that protrudes beyond the main body 1531 so as to abut the substrate W. Specifically, the abutting member 1532 may include the abutting portion 1532B located outside the chamber 1531D, a sliding portion 1532C located inside the chamber 1531D, and an elongated connection portion 1532D connecting the abutting portion 1532B and the sliding portion 1532C, in some embodiments. The opening 1531E may have a size or width that allows the elongated connection portion 1532D to pass through (i.e., the width of the opening 1531E is slightly larger than that of the elongated connection portion 1532D), while the sliding portion 1532C cannot pass through the opening 1531E. In some embodiments, an extension part 1532F extends from the main body 1531 at the bottom of the chamber 1531D, thereby defining the opening 1531E (i.e., the extension part 1532F is formed along the opening 1531E).

In some embodiments, the abutting portion 1532B has a width W1 in cross-section, the sliding portion 1532C has a width W2 in cross-section, and the elongated connection portion 1532D has a width W3 in cross-section, wherein W1>W2>W3. As described above, the abutting portion 1532B of the abutting member 1532 forms an inclined surface 1532A so as to make point contact with the substrate W. In some embodiments, the abutting member 1532 is made of a wear resistant material, for example, polytetrafluoroethylene (PTFE) or the like.

The pusher 1533 may be configured to push the abutting member 1532 to move toward the substrate W. In some embodiments, the pusher 1533 is configured to continuously push the abutting member 1532 to move toward the substrate W such that the abutting member 1532 continuously touches or contacts the substrate W when the substrate W is secured by the suction units 152 during the transfer. For example, as shown in FIG. 4, the pusher 1533 is an elastic member (e.g., a compression spring) disposed between the main body 1531 and the abutting member 1532. In some embodiments, the pusher 1533 (compression spring) can be disposed in the chamber 1531D of the main body 1531 with one end abutting an inner wall portion (e.g., the shown inner upper wall portion) of the chamber 1531D and the other end abutting the sliding portion 1532C of the abutting member 1532. Accordingly, the abutting member 1532 can be continuously pushed by the pusher 1533 to move relative to the main body 1531 toward the substrate W (e.g., in the down direction D1 shown in FIG. 4), so that the length (in the vertical direction) of the movement restriction unit 153 is increased and the extended abutting member 1532 can touch or contact the substrate W more easily.

On the other hand, the pusher 1533 using an elastic member or a compression spring absorbs the impact caused by the lifting substrate W (lifted by the suction units 152) initially touching the hard abutting member 1532, thereby avoiding damage (e.g., rupture or crack) to the substrate W. Furthermore, the elasticity of the pusher 1533 also allows the abutting member 1532 to retract into the chamber 1531D of the main body 1531 (e.g., in the up direction D2 shown in FIG. 9) when the substrate W is lifted by the suction units 152 and presses against the abutting member 1532 (which will be described in detail later). In some exemplary cases, the compression spring used can have a spring constant of between about 0.05 N/mm and about 0.1 N/mm. It should be understood that if the spring constant is less than about 0.05 N/mm, the elastic force of the pusher 1533 may be too less to push the abutting member 1532 to move toward the substrate W; whereas, if the spring constant is greater than about 0.1 N/mm, the elastic force of the pusher 1533 may be too strong (i.e., the pusher 1533 can be referred to a rigid body) so that it cannot effectively absorb the impact, and the substrate W may be easily damaged when the substrate W collides with the abutting member 1532.

In some embodiments, as shown in FIG. 4, the main body 1531 further has a recess 1531G formed therein (e.g., formed on the inner upper wall portion of the chamber 1531D) for receiving and installing the compression spring.

In some embodiments, the (maximum) moving range X (see FIG. 4) of the abutting member 1532 in the chamber 1531D is determined by the distance between the extension part 1532F (located at the bottom of the chamber 1531D) and the inner upper wall portion of the chamber 1531D opposite the extension part 1532F minus the height (in the vertical direction) of the sliding portion 1532C. In some exemplary cases, the moving range X of the abutting member 1532 is about 3 mm so as to improve the compatibility for various kinds of substrate warpage situation (for example, the transfer device 15 can be suitable for the bowed substrate W being in the form of a crying face or a smiling face with varying degrees of warpage).

In some embodiments, as shown in FIG. 4, the width W2 of the sliding portion 1532C of the abutting member 1532 received in the chamber 1531D is substantially equal to the width W4 of the chamber 1531D, thereby avoiding the abutting member 1532 offset while the abutting member 1532 is moving relative to the main body 1531. As a result, the stability of the transfer device 15 is improved.

Figure 5:
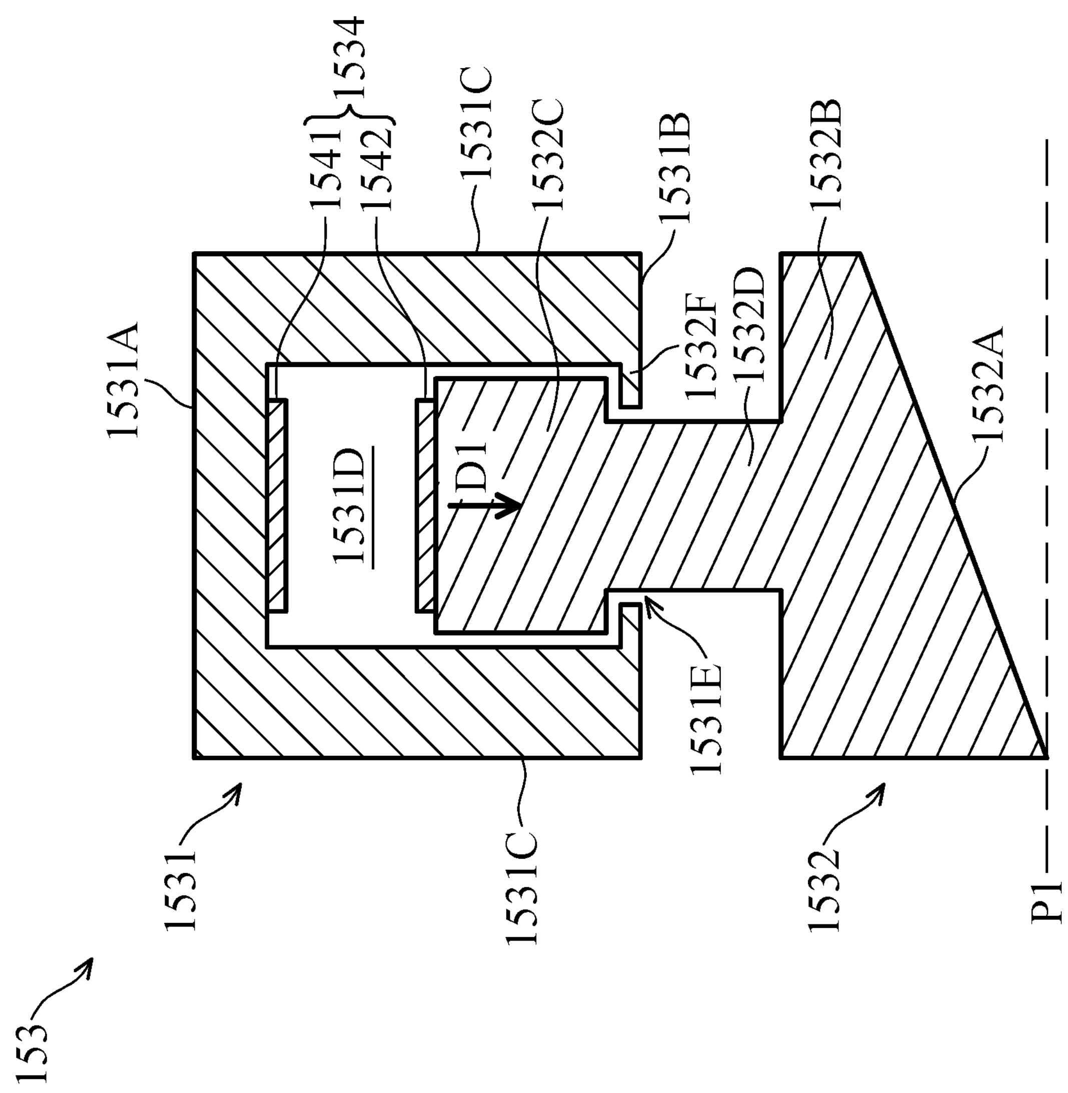
FIG. 5 is a schematic cross-sectional view showing the configuration of the movement restriction unit of the second transfer device in accordance with some embodiments.

It should be understood that many variations and modifications can be made to embodiments of the disclosure. For example, the pusher of the movement restriction unit 153 is not limited to an elastic member. Referring to FIG. 5, which is a schematic cross-sectional view showing the configuration of the movement restriction unit 153 of the transfer device 15 in accordance with some other embodiments. In FIG. 5, the movement restriction unit 153 employs a pusher 1534 instead of the pusher 1533 (elastic member) in FIG. 4.

The pusher 1534 may include two magnetic elements 1541 and 1542 with opposite magnetic polarities, in some embodiments. One magnetic element 1541 is attached to main body 1531 (e.g., attached to the inner upper wall portion of the chamber 1531D), and the other magnetic element 1542 is attached to the sliding portion 1532C of the abutting member 1532 and positioned opposite the magnetic element 1541. Accordingly, a magnetic repulsive force generated by the two magnetic elements 1541 and 1542 can continuously push the abutting member 1532 to move toward the substrate W (e.g., in the down direction D1 shown in FIG. 5) such that the abutting member 1532 continuously touches or contacts the substrate W when the substrate W is secured by the suction units 152 during the transfer. Furthermore, when the substrate W is lifted by the suction units 152 and presses against the abutting member 1532, the pusher 1534 using the magnetic elements also allows the abutting member 1532 to retract into the chamber 1531D of the main body 1531 (such as in the up direction D2 shown in FIG. 9) so as to absorb the impact caused by collision between the substrate W and the abutting member 1532 (which will be described in detail later).

Figure 6:
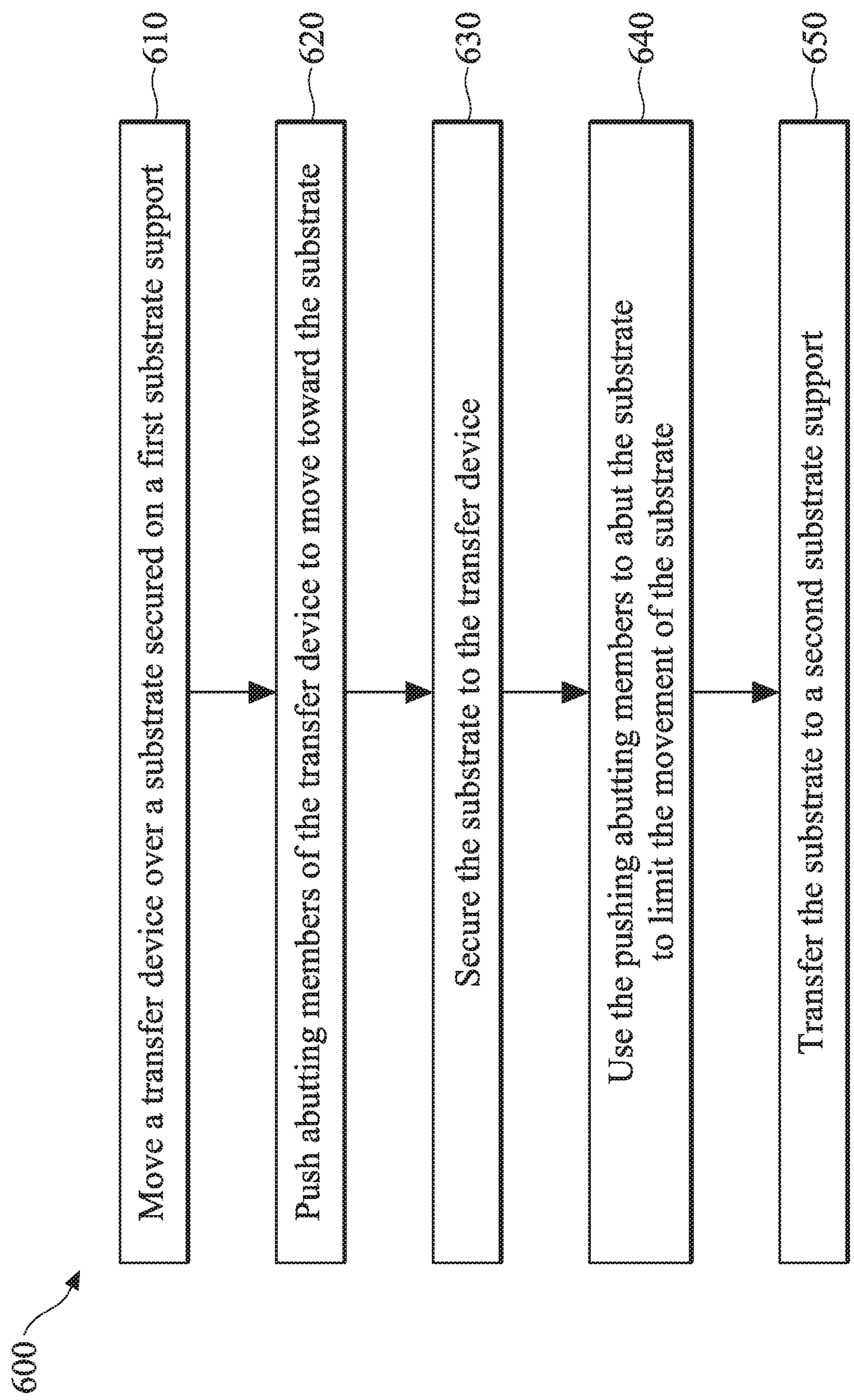
FIG. 6 is a simplified flowchart of a method of transferring a substrate using the second transfer device, in accordance with some embodiments.

Next, referring to FIG. 6, which is a simplified flowchart of a method 600 of transferring a substrate W using the transfer device 15 described above, in accordance with some embodiments. For illustration, the flow chart will be described along with the drawings shown in FIGS. 7 to 10. Some of the described operations can be replaced or eliminated in different embodiments. Alternatively, some operations may be added in different embodiments.

Figure 7:
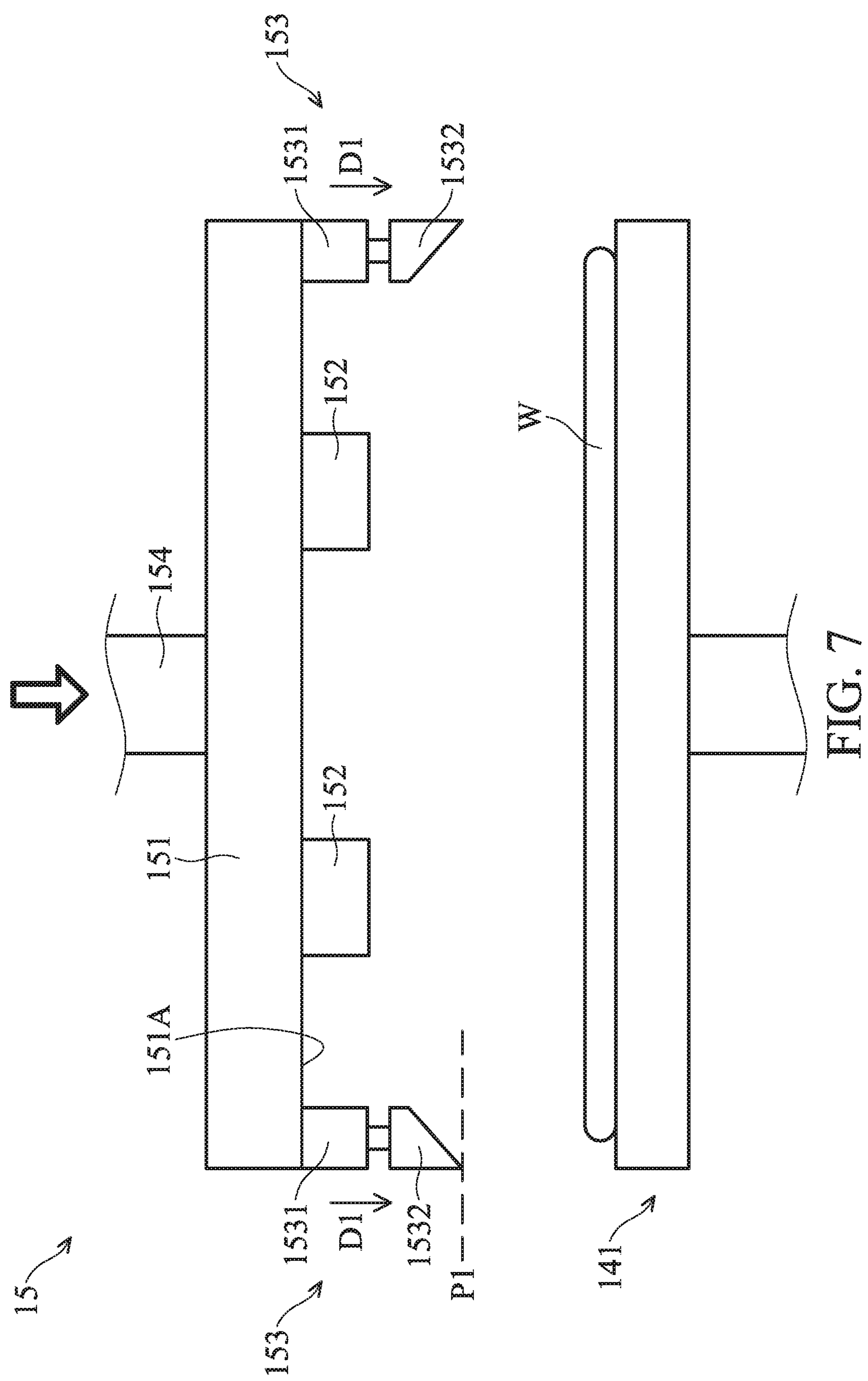
FIG. 7 is a schematic view showing one stage of a method of transferring a substrate using the second transfer device, in accordance with some embodiments.

The method 600 begins with operation 610, in which the transfer device 15, equipped with the movement restriction units 153 in FIG. 4 or FIG. 5, is moved over a substrate W (to be transferred) secured on a first substrate support, as shown in FIG. 7. In some embodiments where the substrate W is to be transferred from the positioning stage 141 to the cutting stage 161, the first substrate support (of operation 610) is the positioning stage 141, as shown in FIG. 7. In some embodiments where the substrate W is to be transferred from the cutting stage 161 to the first transfer device 13, the first substrate support (of operation 610) is the cutting stage 161.

The method 600 continues to operation 620, in which the abutting member 1532 of the respective movement restriction units 153 of the transfer device 15 is pushed to move toward the substrate W (e.g., in the down direction D1), while the substrate W is not picked up by the suction units 152 of the transfer device 15, as shown in FIG. 7. In some embodiments, the abutting member 1532 can be pushed by, for example, the pusher 1533 in FIG. 4 or the pusher 1534 in FIG. 5, to move relative to the main body 1531 of the movement restriction unit 153 toward the substrate W. Before the substrate W is picked up by the suction units 152 of the transfer device 15, the abutting member 1532 is pushed (relative to the main body 1531) toward the substrate W to reach a first position P1 (also referred to as an extended position), as shown in FIG. 7. In some embodiments, as shown in FIG. 4 or FIG. 5, the first position P1 is determined by the location of the extension part 1532F. For example, when the abutting member 1532 is pushed by the pusher 1533 or the pusher 1534, it will continuously move toward the substrate W until the sliding portion 1532C touches the extension part 1532F located at the bottom of the chamber 1531D. In other words, the pushed, extended abutting member 1532 stays at the first position P1 before it is pressed by the lifting substrate W.

Figure 8:
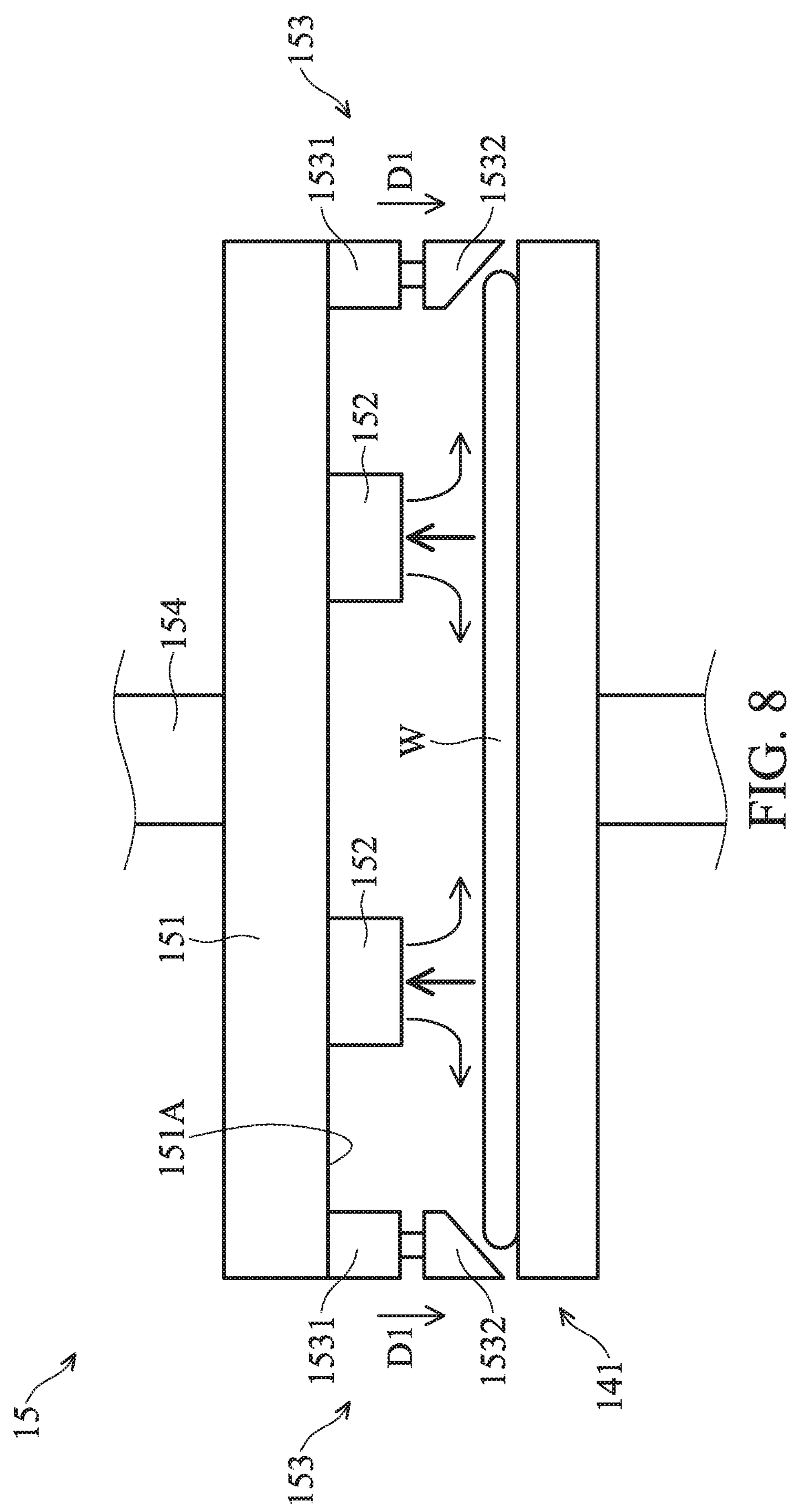
FIG. 8 is a schematic view showing one stage of a method of transferring a substrate using the second transfer device, in accordance with some embodiments.

The method 600 continues to operation 630, in which the substrate W is secured by the transfer device 15. In some embodiments, when the transfer device 15 is controlled to take the substrate W from the first substrate support (e.g., the positioning stage 141), first, the transfer device 15 may be lowered to a predetermined height (as shown in FIG. 8), and then the suction units 152 are activated. In some embodiments, each of the suction units 152 is a Bernoulli suction unit (nozzle) operable to blow out a pressurized air from its spraying hole in the direction of the movement restriction units 153 when the suction unit 152 is activated. Based on the Bernoulli principle, a suction force (i.e., a lifting force; as indicated by the up arrows in FIG. 8) is generated and acts on the substrate W so that the substrate W can be lifted without abutting against the lower surfaces of the suction units 152 (in a non-contact suction manner).

Figure 9:
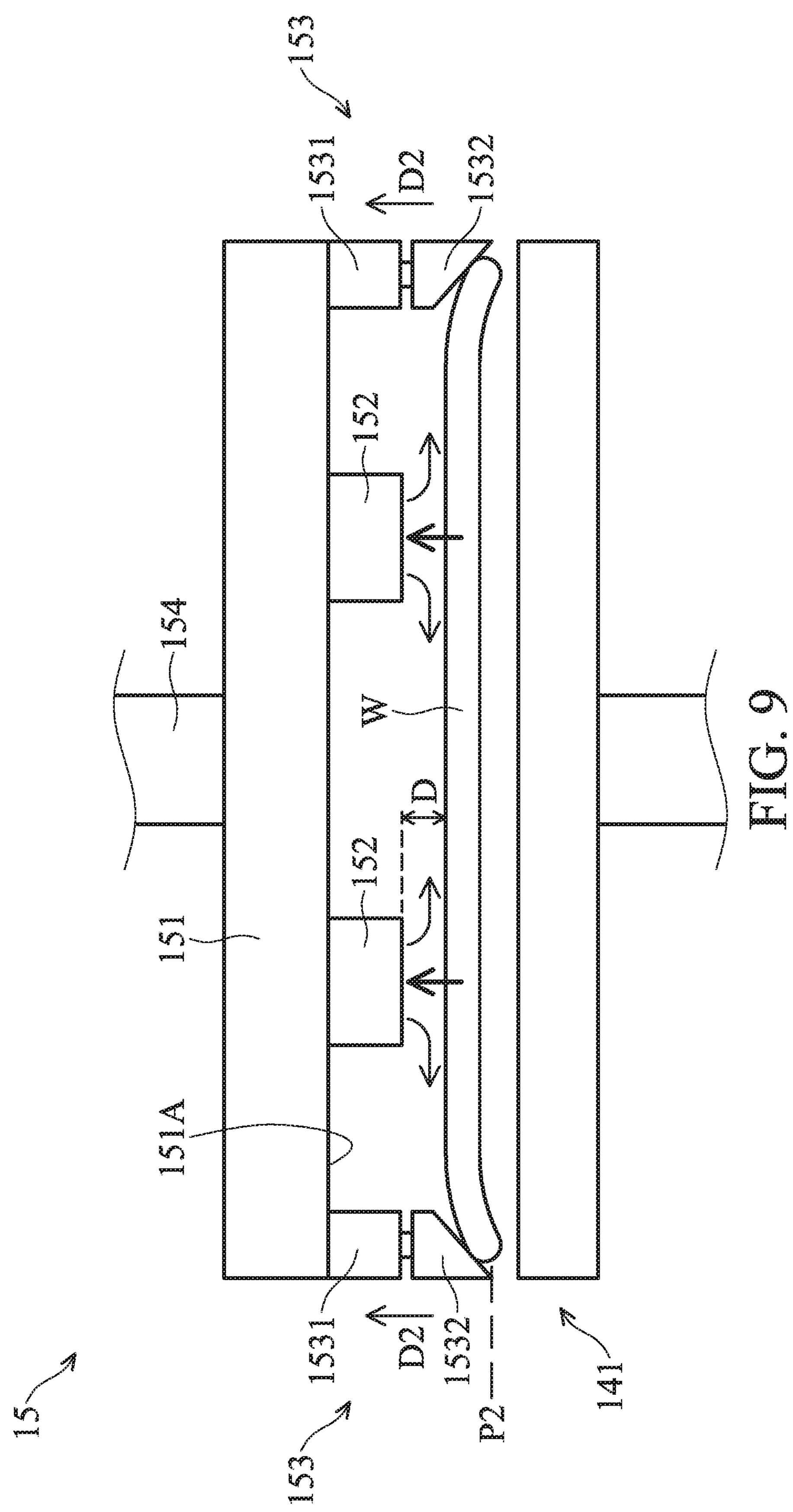
FIG. 9 is a schematic view showing one stage of a method of transferring a substrate using the second transfer device, in accordance with some embodiments.

The method 600 continues to operation 640, in which the pushing abutting members 1532 touch the substrate W to limit the movement (e.g., rotation) of the substrate W while the substrate W is secured by the transfer device 15, as shown in FIG. 9. In some embodiments, when the substrate W is lifted or attracted by the suction units 152 and presses against the extended abutting members 1532, the pusher 1533 or the pusher 1534 allows the respective abutting member 1532 to retract into the chamber 1531D (i.e., move relative to the main body 1531 toward the base plate 151; see FIG. 4 or FIG. 5) of the main body 1531 (e.g., in the up direction D2 shown in FIG. 9) until the substrate W reaches a position where it is stably secured (i.e., do not float up and down) by the suction units 152 (for example, the position may have a distance D of about 0.5 mm from the lower surfaces of the suction units 152). At the same time, the abutting member 1532 reaches a second position P2 (also referred to as a retracted position), relative to the main body 1531, as shown in FIG. 9.

Through this approach, the pusher 1533 or the pusher 1534 absorbs the impact caused by the lifting substrate W initially touching the hard abutting member 1532, thereby avoiding damage (e.g., rupture or crack) to the substrate W. Furthermore, the pusher 1533 or the pusher 1534 continuously pushes the abutting member 1532 toward the substrate W to abut or contact the substrate W by the abutting member 1532 while the substrate W is secured by the transfer device 15 (including the duration that the abutting member 1532 moves between the first position or extended position P1 and a second position or retracted position P2), so that the unexpected rotation of the substrate W is avoided.

Figure 10:
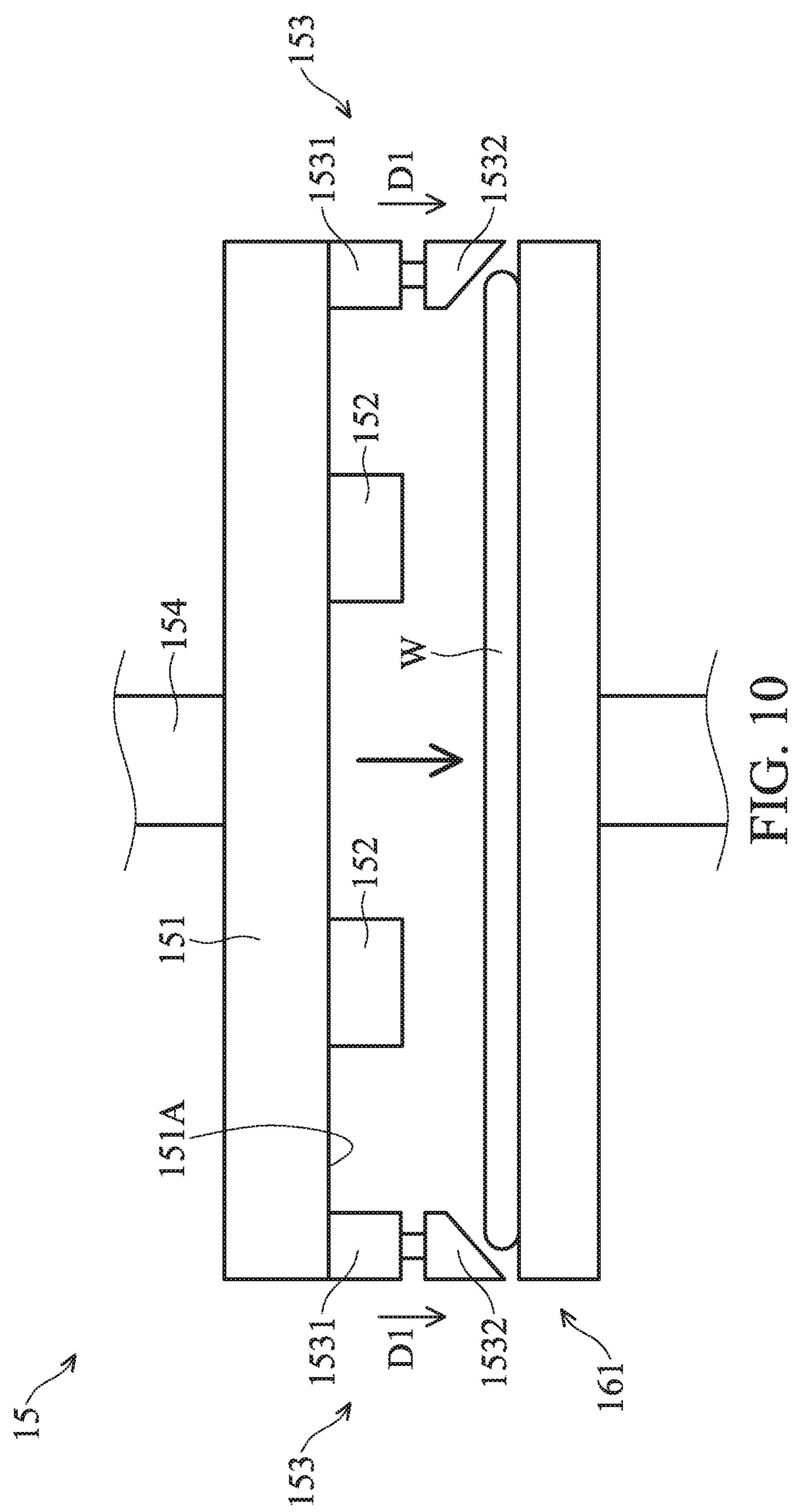
FIG. 10 is a schematic view showing one stage of a method of transferring a substrate using the second transfer device, in accordance with some embodiments.

The method 600 continues to operation 650, in which the substrate W is transferred by the transfer device 15 to a second substrate support, as shown in FIG. 10. In some embodiments where the substrate W is to be transferred from the positioning stage 141 to the cutting stage 161, the second substrate support (of operation 650) is the cutting stage 161, as shown in FIG. 10. In some embodiments where the substrate W is to be transferred from the cutting stage 161 to the first transfer device 13, the second substrate support (of operation 650) is the first transfer device 13. After the transfer device 15 is moved to a position over the second substrate support, it may be lowered to a predetermined height (as shown in FIG. 10), and then the suction units 152 are powered off. Consequently, the substrate W is released and falls on the second substrate support (i.e., transportation is completed). Note that when the substrate W is released from the transfer device 15, the elastic or magnetic force of the pushers 1533 or 1534 pushes the abutting members 1532 back to the first position or extended position (see FIG. 10). The operation 620 may be performed throughout the entire method 600 in some embodiments.

The embodiments of the present disclosure have some advantageous features: by providing pushers to the movement restriction units of the transfer device to continuously push the abutting members to move toward the substrate, the abutting members continuously touch or contact the substrate when secured by the transfer device during the transfer, so that the unexpected rotation of the substrate during transportation is avoided. As a result, some abnormalities in the subsequent processes can be further avoided. Moreover, the pushers can absorb the impact caused by the lifting substrate initially touching the hard abutting member, thereby avoiding damage (e.g., rupture or crack) to the substrate.

In some embodiments, a transfer device for transferring a substrate is provided, including a base plate, at least one suction unit, and a plurality of movement restriction units. The at least one suction unit is disposed on the side of the base plate facing the substrate and configured to generate suction on the substrate. The movement restriction units are disposed on the side of the base plate and configured to limit the movement of the substrate during transfer. Each of the movement restriction units includes a main body, an abutting member, and a pusher. The main body is attached to the base plate and has a chamber therein. The abutting member is movably received in the chamber and has an abutting portion that protrudes beyond the main body to abut the substrate. The pusher is received in the chamber and configured to push the abutting member to move toward the substrate.

In some embodiments, a transfer device for transferring a substrate is provided, including a base plate, at least one suction unit, and a plurality of movement restriction units. The at least one suction unit is disposed on the side of the base plate facing the substrate and configured to generate suction on the substrate. The movement restriction units are disposed on the side of the base plate and configured to limit the movement of the substrate during transfer. Each of the movement restriction units includes a main body attached to the base plate, an abutting member configured to abut the substrate to limit the movement of the substrate, and a pusher disposed between the main body and the abutting member. The pusher is configured to push the abutting member to move relative to the main body toward the substrate to reach a first position, while the substrate is not picked up by the at least one suction unit; and allow the abutting member to move relative to the main body toward the base plate to reach a second position other than the first position, while the substrate is secured by the at least one suction unit and in contact with the abutting member.

In some embodiments, a method of transferring a substrate is provided. The method includes moving a transfer device over the substrate placed on a first substrate support, wherein the transfer device includes a base plate, at least one suction unit and a plurality of movement restriction units on the base plate. The method also includes pushing the abutting member of each of the movement restriction units to move toward the substrate. The method further includes securing the substrate to the transfer device in a non-contact manner by the at least one suction unit generating suction on the substrate. The method further includes using the pushing abutting members to abut the substrate and thereby limit the movement of the substrate while the substrate is secured by the transfer device. In addition, the method includes transferring the transfer device with the substrate to a second substrate support.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may vary while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A transfer device for transferring a substrate, comprising:

a base plate;

at least one suction unit disposed on a side of the base plate facing the substrate, configured to generate suction on the substrate; and a plurality of movement restriction units disposed on the side of the base plate, configured to limit the movement of the substrate during transfer, wherein each of the movement restriction units comprises:

a main body attached to the base plate, wherein the main body has a chamber therein;

an abutting member movably received in the chamber and having an abutting portion that protrudes beyond the main body to abut the substrate; and a pusher received in the chamber, configured to push the abutting member to move toward the substrate.

2. The transfer device as claimed in claim 1, wherein the at least one suction unit is arranged in a central region of the base plate, and the movement restriction units are distributed in a peripheral region of the base plate surrounding the central region and configured to limit the movement of the substrate by contacting edge points of the substrate.

3. The transfer device as claimed in claim 2, wherein the abutting portion of the abutting member has an inclined surface configured to contact the substrate.

4. The transfer device as claimed in claim 1, wherein the abutting member comprises a wear resistant material.

5. The transfer device as claimed in claim 1, wherein the pusher comprises an elastic member that is disposed between an inner wall portion of the chamber and the abutting member.

6. The transfer device as claimed in claim 5, wherein the elastic member is a compression spring with one end abutting the inner wall portion of the chamber and the other end abutting the abutting member.

7. The transfer device as claimed in claim 6, wherein the compression spring has a spring constant of between about 0.05 N/mm and about 0.1 N/mm.

8. The transfer device as claimed in claim 1, wherein a portion of the abutting member received in the chamber has a width that is substantially equal to that of the chamber.

9. The transfer device as claimed in claim 1, wherein an extension part extends from the main body at a bottom of the chamber, and a moving range of the abutting member in the chamber is determined by a distance between the extension part and an inner wall portion of the chamber opposite the extension part minus a height of a portion of the abutting member in the chamber.

10. The transfer device as claimed in claim 1, wherein the at least one suction unit is configured to generate suction to hold the substrate in a non-contact manner.

11. A transfer device for transferring a substrate, comprising:

a base plate;

at least one suction unit disposed on a side of the base plate facing the substrate, configured to generate suction on the substrate; and a plurality of movement restriction units disposed on the side of the base plate, configured to limit the movement of the substrate during transfer, wherein each of the movement restriction units comprises a main body attached to the base plate, an abutting member configured to abut the substrate to limit the movement of the substrate, and a pusher disposed between the main body and the abutting member, wherein the pusher is configured to:

push the abutting member to move relative to the main body toward the substrate to reach a first position, while the substrate is not picked up by the at least one suction unit; and allow the abutting member to move relative to the main body toward the base plate to reach a second position other than the first position, while the substrate is secured by the at least one suction unit and is in contact with the abutting member.

12. The transfer device as claimed in claim 11, wherein the abutting member of each of the movement restriction units continuously contacts the substrate during movement of the abutting member between the first position and the second position.

13. The transfer device as claimed in claim 11, wherein the pusher comprises a compression spring with one end abutting the main body and the other end abutting the abutting member.

14. The transfer device as claimed in claim 13, wherein the main body has a recess formed therein for installing the compression spring.

15. The transfer device as claimed in claim 11, wherein the pusher comprises a first magnetic element attached to main body and a second magnetic element attached to the abutting member and positioned opposite the first magnetic element, wherein the first and second magnetic elements have opposite magnetic polarities.

16. The transfer device as claimed in claim 11, wherein the at least one suction unit is a Bernoulli suction unit configured to generate suction to hold the substrate in a non-contact manner.

17. A method of transferring a substrate, comprising:

moving a transfer device over the substrate secured on a first substrate support, wherein the transfer device comprises a base plate, at least one suction unit and a plurality of movement restriction units on the base plate;

pushing an abutting member of each of the movement restriction units to move toward the substrate;

securing the substrate to the transfer device by the at least one suction unit generating suction on the substrate;

using the pushing abutting members to abut the substrate to limit the movement of the substrate while the substrate is secured by the transfer device; and transferring the transfer device with the substrate to a second substrate support;

wherein each of the movement restriction units comprises a main body attached to the base plate, the abutting member, and a pusher disposed between the main body and the abutting member, wherein the operation of pushing the abutting member is performed by pushing the abutting member by the pusher to move relative to the main body toward the substrate.

18. The method as claimed in claim 17, wherein the pusher is an elastic member that generates an elastic force to continuously push the abutting member toward the substrate to abut the substrate while the substrate is secured by the transfer device in a non-contact manner.

19. The method as claimed in claim 17, wherein the pusher allows the abutting member to move toward the base plate when the substrate is secured by the transfer device and presses against the abutting member.

20. The method as claimed in claim 17, wherein the at least one suction unit is arranged in a central region of the base plate, and the movement restriction units are distributed in a peripheral region of the base plate surrounding the central region and configured to limit the movement of the substrate by contacting edge points of the substrate.

* * * * *